United States Patent
Yasuda (10) Patent No.: US 9,425,207 B2
(45) Date of Patent: Aug. 23, 2016

(54) MEMORY DEVICE WITH DIFFERENT MEMORY FILM DIAMETERS IN THE SAME LAMINATE LEVEL

(71) Applicant: Kabushiki Kaisha Toshiba, Minato-ku (JP)

(72) Inventor: Naoki Yasuda, Mie (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/521,577

(22) Filed: Oct. 23, 2014

(65) Prior Publication Data

US 2016/0005755 A1 Jan. 7, 2016

Related U.S. Application Data

(60) Provisional application No. 62/020,444, filed on Jul. 3, 2014.

(51) Int. Cl.
| | |
|---|---|
| *H01L 27/115* | (2006.01) |
| *G11C 16/14* | (2006.01) |
| *G11C 11/56* | (2006.01) |
| *G11C 8/14* | (2006.01) |
| *G11C 16/04* | (2006.01) |
| *G11C 29/50* | (2006.01) |

(52) U.S. Cl.
CPC ...... *H01L 27/11582* (2013.01); *G11C 11/5671* (2013.01); *G11C 16/14* (2013.01); *H01L 27/11565* (2013.01); *G11C 8/14* (2013.01); *G11C 16/04* (2013.01); *G11C 29/50016* (2013.01)

(58) Field of Classification Search
None
See application file for complete search history.

(56) References Cited

U.S. PATENT DOCUMENTS

| 8,829,593 B2 | 9/2014 | Sekine et al. | |
|---|---|---|---|
| 2010/0237402 A1 | 9/2010 | Sekine et al. | |
| 2011/0012188 A1* | 1/2011 | Kito | H01L 27/11578 257/324 |
| 2013/0320425 A1 | 12/2013 | Yasuda | |
| 2014/0226406 A1* | 8/2014 | Dong | G11C 11/5628 365/185.17 |
| 2015/0121157 A1* | 4/2015 | Raghu | G11C 29/82 714/723 |

FOREIGN PATENT DOCUMENTS

JP  2011-066348  3/2011

* cited by examiner

*Primary Examiner* — Kretelia Graham
(74) *Attorney, Agent, or Firm* — Oblon, McClelland, Maier & Neustadt, L.L.P.

(57) ABSTRACT

According to one embodiment, a non-volatile memory device includes first electrodes, at least one first semiconductor layer, a first memory film, second electrodes, at least one second semiconductor layer, and a second memory film. The first electrodes are stacked in a first direction. The one first semiconductor layer extends in the first direction through the first electrodes. The first memory film is provided between each of the first electrodes and the one first semiconductor layer. The second electrodes are stacked in the first direction and provided together with the first electrodes in a second direction orthogonal to the first direction. The one second semiconductor layer extends in the first direction through the second electrodes. The second memory film is provided between each of the second electrodes and the one second semiconductor layer. An outer diameter of the first memory film is larger than that of the second memory film.

15 Claims, 6 Drawing Sheets

MEMORY HOLE DIAMETER

MEMORY DEVICE WITH DIFFERENT MEMORY FILM DIAMETERS IN THE SAME LAMINATE LEVEL

CROSS-REFERENCE TO RELATED APPLICATIONS

This application is based upon and claims the benefit of priority from U.S. Provisional Patent Application 62/020,444, filed on Jul. 3, 2014; the entire contents of which are incorporated herein by reference.

FIELD

Embodiments described herein relate generally to a non-volatile memory device.

BACKGROUND

In order to realize a non-volatile memory device for the next generation, a memory cell array of three-dimensional structure has been developed. The memory cell array of three-dimensional structure includes a plurality of stacked word lines, and memory cells formed inside memory holes passing through the word lines. Such a non-volatile memory device includes a memory cell which repeats writing and erasing of data, and a memory cell which retains predetermined data for a long time. Then, good retention characteristics are required for the memory cell which retains the data for a long time.

BRIEF DESCRIPTION OF THE DRAWINGS

FIGS. 7A to 8 are examples of schematic planar views showing the memory cell arrays according to a variation of the first embodiment.

DETAILED DESCRIPTION

According to one embodiment, a non-volatile memory device includes a plurality of first electrodes, at least one first semiconductor layer, a first memory film, a plurality of second electrodes, at least one second semiconductor layer, and a second memory film. The first electrodes are stacked in a first direction. The one first semiconductor layer extends in the first direction through the first electrodes. The first memory film is provided between each of the first electrodes and the first semiconductor layer. The second electrodes are stacked in the first direction and provided together with the first electrodes in a second direction orthogonal to the first direction. The one second semiconductor layer extends in the first direction through the second electrodes. The second memory film is provided between each of the second electrodes and the second semiconductor layer. An outer diameter of the first memory film provided between one of the first electrodes and the one first semiconductor layer is larger than an outer diameter of the second memory film provided between one of the second electrodes positioned in the same laminate level as the one of the first electrodes and the one second semiconductor layer.

Various embodiments will be described hereinafter with reference to the accompanying drawings. The same portions in the drawings are denoted by the same number, detailed description thereof will be appropriately omitted, and the other portions will be described. In addition, the drawings are schematic or conceptual drawings, and a relationship between a thickness and a width of each portion, a ratio of sizes of each portion, or the like is not necessarily limited to the same as actual ones. Even if the same portions are represented, there is also a case where the dimensions or the ratio of the same portions are represented differently from each other according to the drawing. There is a case where arrangement of each element is described using a direction of an x axis, a y axis, or a z axis illustrated in the drawing. There is a case where the x axis, the y axis, and the z axis are orthogonal to each other, the z axis direction is referred to as an upward direction, and an opposite direction thereto is referred to as a downward direction.

First Embodiment

Figure 1A:
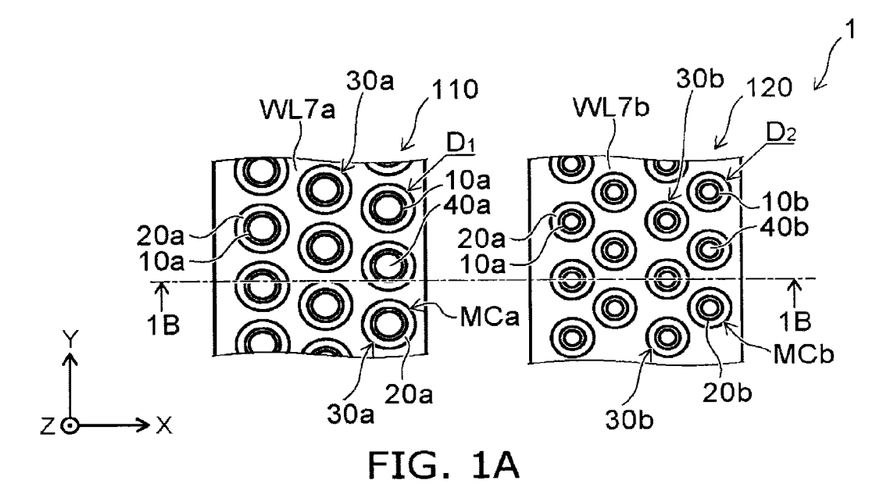
FIGS. 1A and 1B are examples of a schematic view showing a non-volatile memory device according to a first embodiment.
Figure 1B:
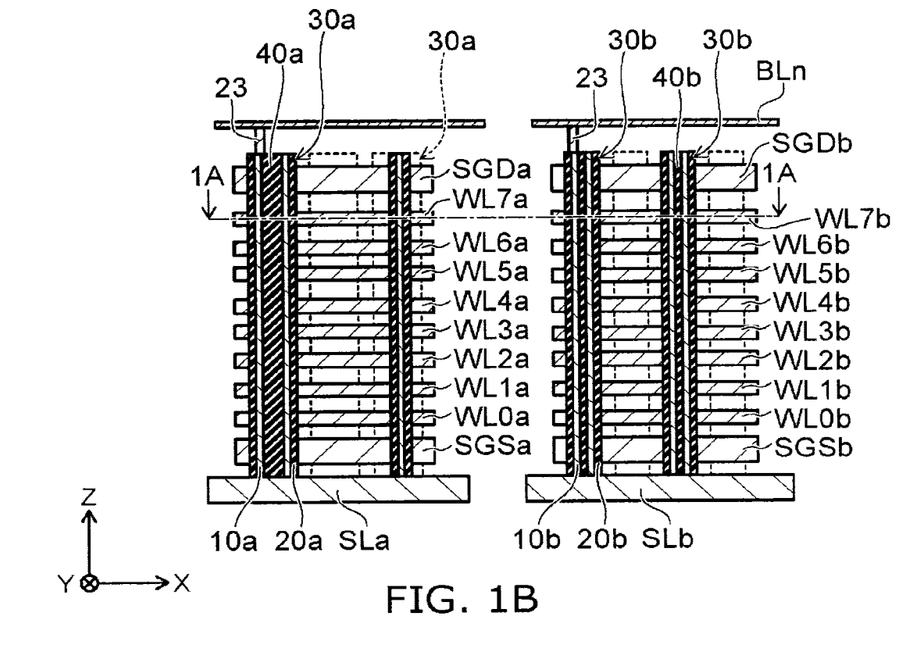

FIGS. 1A and 1B are examples of a schematic view showing a memory cell array 1 of a non-volatile memory device 100 according to a first embodiment. FIG. 1A is a cross-sectional view taken along a line 1A-1A shown in FIG. 1B. FIG. 1B is a cross-sectional view taken along a line 1B-1B shown in FIG. 1A.

A memory cell array 1 includes a plurality of first electrodes (hereinafter, referred to as word lines WL0a to WL7a), and a plurality of second electrodes (hereinafter, referred to as word lines WL0b to WL7b). Each of the word lines WL0a to WL7a and the word lines WL0b to WL7b is stacked in a first direction (hereinafter, referred to as a Z-direction). In addition, a laminate body 110 which includes the word lines WL0a to WL7a, and a laminate body 120 which includes the word lines WL0b to WL7b are arranged in parallel in a second direction (hereinafter, referred to as an X-direction).

The memory cell array 1 includes at least one first semiconductor layer (hereinafter, referred to as a channel body 10a), and at least one second semiconductor layer (hereinafter, referred to as a channel body 10b). The channel body 10a extends in the Z-direction through a center of the word lines WL0a to WL7a. The channel body 10b extends in the Z-direction through a center of the word lines WL0b to WL7b.

The memory cell array 1 further includes a first memory film (hereinafter, referred to as a memory film 20a) and a second memory film (hereinafter, referred to as a memory film 20b). The memory film 20a is provided between each of the word lines WL0a to WL7a and the channel body 10a. The memory film 20b is provided between each of the word lines WL0b to WL7b and the channel body 10b.

A memory cell MC is formed between each word line WL and the channel body 10. A first memory cell (hereinafter referred to as a memory cell MCa) is formed between each of the plurality of word lines WLa and the channel body 10a, and includes the memory film 20a. A second memory cell (hereinafter referred to as a memory cell MCb) is formed between each of the plurality of word lines WLb and the channel body 10b, and includes the memory film 20b.

In addition, in the specification, for example, there is a case where the plurality of word lined WL0a to WL7a are briefly represented by word lines WLa, and the plurality of word lines WL0b to WL7b are briefly represented by word lines WLb. In addition, there is a case where the plurality of word lines as a whole are represented by the word lines WL. In the same manner, there is a case where the memory cells MC0a to MC7a and the memory cells MC0b to MC7b are also represented by memory cells MCa, MCb and MC. In addition, this is the same as in the other configuration elements.

As shown in FIG. 1A, an outer diameter of the memory film 20a which is provided between one word line WLka (k is an integer) of the plurality of word lines WLa and the channel body 10a is larger than an outer diameter of the memory film 20b which is provided between one word line WLkb of the plurality of word lines WLb and the channel body 10b. Here, the outer diameter refers to a diameter of an outer perimeter of the memory film 20 in the cross-section orthogonal to the Z-direction. In addition, the outer diameters of the memory films 20 are compared between the word lines WL which are positioned at the same laminate level (k is equal).

For example, the outer diameter D1 of the memory film 20a which is provided between the word line WL7a in the top layer of the plurality of word lines WLa and the channel body 10a is larger than the outer diameter D2 of the memory film 20b which is provided between the word line WL7b in the top layer of the plurality of word lines WLb and the channel body 10b.

In this manner, the memory cell array 1 includes at least two types of memory films 20a and 20b having a different outer diameter from each other. For example, when the same voltage is applied to the memory cell MC7a between the word line WL7a and the channel body 10a, and to the memory cell MC7b between the word line WL7b and the channel body 10b, an electric field of the memory film 20b is stronger than an electric field of the memory film 20a, because of a curvature difference between the memory films 20.

For example, if minimum electric fields of the memory films 20a and 20b which are required for writing (or erasing) data to the memory cells MC7a and MC7b are the same, a minimum value of a writing voltage of the memory cell MC7a is greater than a minimum value of a writing voltage of the memory cell MC7b (the same applies to an erasing voltage). This is because the memory cell MC7b is more greatly affected by the concentration of electric field towards a central portion of the memory cell and electric field relaxation at an outer perimeter portion of the memory cell, compared to the memory cell MC7a. A shape effect of such a memory cell appears not only in writing or erasing of the data, but also in other characteristics of the memory cell. That is, by making the outer diameter of the memory film large and by relaxing the concentration of electric field toward a tunnel insulating film, the memory cell MC7a has better data retention characteristics than the memory cell MC7b. In addition, even with respect to read disturb at the time of data reading, the memory cell MC7a has a smaller amount of data disturb than that of the memory cell MC7b.

According to an embodiment, for example, the memory cells MCa provided in the laminate body 110 all include the memory film 20a. The memory cells MCb provided in the laminate body 120 all include the memory film 20b. Then, the memory cell MCa of the laminate body 110 has better data retention characteristics than those of the memory cell MCb of the laminate body 120.

In a fabricating process of the memory cell array of the three-dimensional structure, for example, an insulating film layer and an electrode layer are stacked in a first direction, and a memory hole is formed by etching the insulating film layer and the electrode layer all at once. Subsequently, in the memory hole, a memory film and a channel body are stacked towards a center of the memory hole. In addition, the memory film and the channel body are formed using, for example, a chemical vapor deposition (CVD) or an atomic layer deposition (ALD). Such film forming methods have a good coverage, and thus an approximately uniform film is formed on a side surface of the memory hole.

For example, the memory cells MCa and the memory cells MCb can be separately formed by forming memory hole patterns having different hole diameters in a photomask (reticle) at the time of forming the memory holes. The other process conditions with respect to the laminate body 110 and the laminate body 120 are all the same. Therefore, the memory film 20a and the memory film 20b have the same structure and the same film thickness. Here, "the same" is not limited to "identical" in the strict sense, and for example, by allowing a difference caused by non-uniformity or the like in a surface direction and a stacking direction during the film formation process using the CVD or the ALD, "approximately the same" is included therein.

The embodiment is not limited to the above-described fabrication method, and the laminate body 110 and the laminate body 120 may be separately formed. For example, while the laminate body 110 or an area of the laminate body 110 is protected by a hard mask, the laminate body 120 is formed. Subsequently, while the laminate body 120 is protected by a hard mask, the laminate body 110 is formed. As a result, the memory film 20a may be formed so as to have a structure and a film thickness which are different from the memory film 20b.

Next, with reference to FIG. 1B to FIG. 3, the structures of the non-volatile memory device 100 and the memory cell array 1 will be more specifically described. The following description is an example of the embodiment, and the invention is not limited to the example.

As shown in FIG. 1B, the laminate body 110 is provided over a source line SLa. The laminate body 110 includes the plurality of word lines WLa, a selection gate SGSa, and a selection gate SGDa. The laminate body 120 includes the plurality of word lines WLb, a selection gate SGSb, and a selection gate SGDb.

For example, the laminate bodies 110 and 120 are patterned in a rectangular body extending in the Y-direction. Each word line WL and the selection gates SGS are patterned in a rectangular shape extending in the Y-direction. A plurality of bit lines BLn are provided over the laminate bodies 110 and 120. The bit lines BLn are respectively mounted over the laminate bodies 110 and 120, and extend in the X-direction. In FIG. 1B, for the sake of simplicity, the insulating films are omitted in which the source lines, the word lines, the selection gate, and the bit lines BLn are electrically insulated with respect to each other.

The selection gate SGSa is provided between the source line SLa and the word line WL0a. The selection gate SGDa is provided between the word line WL7a and the bit line BLn. Then, at least one memory hole 30a is provided in the direction (Z-direction) of the selection gate SGSa from the selection gate SGDa. The memory hole 30a is connected to the source line SLa by passing through the plurality of word lines WLa, and the selection gates SGDa and SGSa.

The selection gate SGSb is provided between the source line SLb and the word line WL0b. The selection gate SGDb is provided between the word line WL7b and the bit line BLn.

At least one memory hole 30b is provided in the direction (–Z-direction) of the selection gate SGSb from the selection gate SGDb. The memory hole 30b is connected to the source line SLb by passing through the plurality of word lines WLb, and the selection gates SGDb and SGSb.

For example, the memory hole 30a is formed in such a manner that a diameter in a cross-section perpendicular to the Z-direction of the memory hole 30a is larger than a diameter in a cross-section perpendicular to the Z-direction of the memory hole 30b. For example, the diameter in the memory hole 30a is 80 nanometers (nm), and the diameter of the memory hole 30b is 60 nm to 70 nm.

The channel body 10a and the memory film 20a are provided inside the memory hole 30a. The memory film 20a is formed on an inside wall of the memory hole 30a. The channel body 10a is formed over the memory film 20a. An edge of the channel body 10a is electrically connected to the source line SLa. The other edge of the channel body 10a is electrically connected to the bit line BLn through a contact plug 23. An insulating core 40a is buried inside the memory hole 30a.

The channel body 10b and the memory film 20b are provided inside the memory hole 30b. The memory film 20b is formed on an inside wall of the memory hole 30b. The channel body 10b is formed over the memory film 20b. An edge of the channel body 10b is electrically connected to the source line SLb. The other edge of the channel body 10b is electrically connected to the bit line BLn through the contact plug 23. An insulating core 40b is buried inside the memory hole 30b.

The memory films 20a and 20b are simultaneously formed, for example, and thicknesses in a direction orthogonal to the Z-direction are the same. In addition, the channel bodies 10a and 10b are also simultaneously formed, and thicknesses in a direction orthogonal to the Z-direction are the same. The outer diameter of the memory film 20a which is formed inside the memory hole 30a is larger than the outer diameter of the memory film 20b which is formed inside the memory hole 30b. The memory cell MCa which includes the memory film 20a is formed between the channel body 10a and each word line WLa. The memory cell MCb which includes the memory film 20b is formed between the channel body 10b and each word line WLb.

A selection transistor SST having the memory film 20 as a gate insulating film is formed between the channel body 10 and the selection gate SGS. In addition, a selection transistor SDT having the memory film 20 as a gate insulating film is formed between the channel body 10 and the selection gate SGD.

For example, the memory film 20 includes a tunnel insulating film in contact with the channel body 10, an electric charge storage layer, and a block insulating film in contact with the word line WL. The electric charge storage layer is provided between the tunnel insulating film and the block insulating film. For example, the memory film 20 includes a silicon oxide film, a silicon nitride film and a silicon oxide film which are sequentially stacked from the word line WL side. The tunnel insulating film and the block insulating film are formed by a silicon oxide film, and the electric charge storage layer is formed by a silicon nitride film.

In the above-described embodiment, the memory film 20 is continuously provided along the inside wall of the memory hole 30. The embodiment is not limited thereto, and for example, the memory films 20 may be separately arranged between each of the plurality of word lines WL and the channel body 10. In such a case, the memory film 20 can include a conducting film which functions as an electric field storage layer, for example, polycrystalline silicon (polysilicon).

For example, a predetermined electric field is applied to the tunnel insulating film in the memory cell MC including the memory film 20, thereby electrons are injected into the electric charge storage layer from the channel body 10 through the tunnel insulating film, and data is written thereto. In addition, an electric field opposite to that at the time of writing data is applied to the tunnel insulating film, and thereby the electrons are emitted to the channel body 10 from the electric field storage layer through the tunnel insulating film, or positive holes are injected into the electric field storage layer from the channel body 10 through the tunnel insulating film, and data is erased.

Even if the same voltage is applied to the memory cell MCa and the memory cell MCb, the intensities of the electric fields of the tunnel insulating films are different from each other, in the memory cells MCa and MCb having different outer diameters of the memory films 20 from each other. That is, by an electric field concentration effect which depends on the curvature of the memory film 20, a stronger electric field than that of the tunnel insulating film of the memory cell MCa occurs in the tunnel insulating film of the memory cell MCb. Thus, the memory cell MCb performs data writing or data erasing at a lower voltage than the voltage applied to the memory cell MCa. In addition, for the same reason as this, retention characteristics of the memory cell MCb are poorer than retention characteristics of the memory cell MCa. In other words, the memory cell MCb is inferior in the data retention characteristics to the memory cell MCa.

Figure 2A:
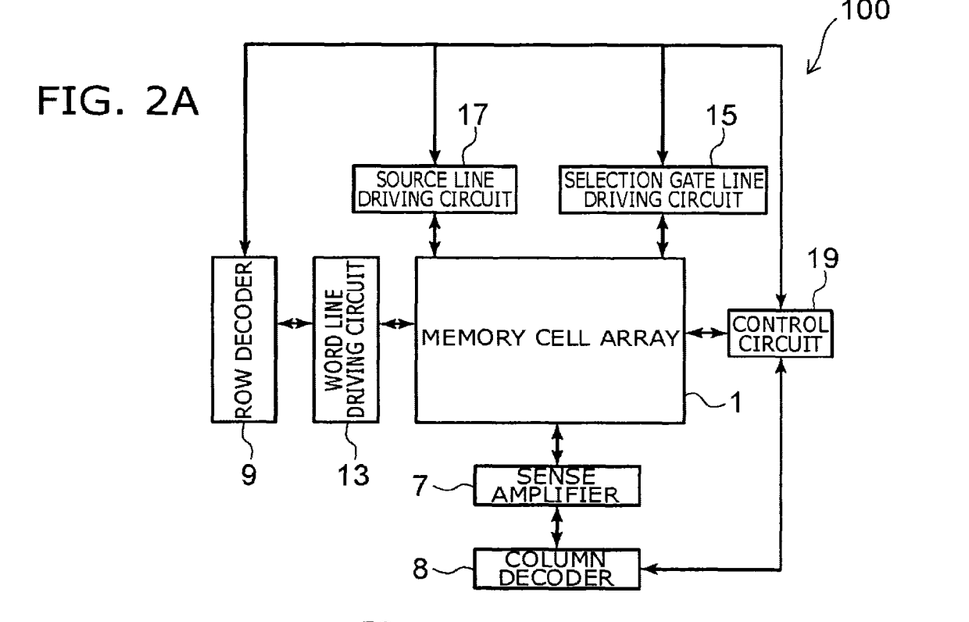
FIGS. 2A and 2B are examples of a block diagram showing the non-volatile memory device according to the first embodiment.
Figure 2B:
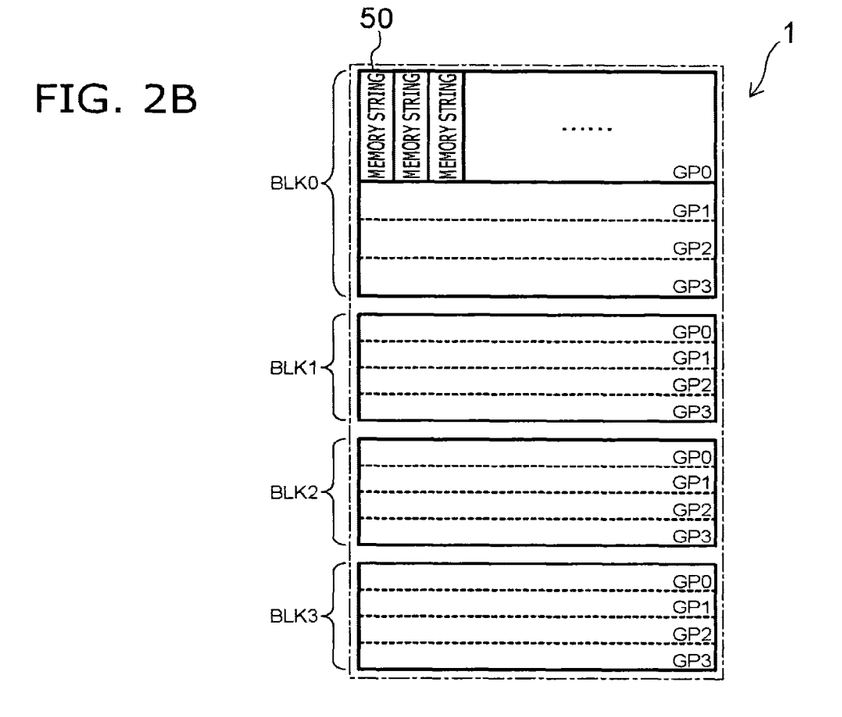

FIGS. 2A and 2B are examples of a schematic view showing the non-volatile memory device 100 according to the first embodiment. FIG. 2A is a block diagram illustrating a configuration of the non-volatile memory device 100. FIG. 2B is a schematic diagram illustrating a planar structure of the memory cell array 1.

As shown in FIG. 2A, the non-volatile memory device 100 includes the memory cell array 1 and a peripheral circuit thereof. The peripheral circuit includes, for example, a sense amplifier 7, a column decoder 8, a row decoder 9, a word line driving circuit 13, a selection gate line driving circuit 15, a source line driving circuit 17, and a control circuit 19.

The word line driving circuit 13 controls a potential of the word line WL, and the source line driving circuit controls a potential of the source line SL. The selection gate line driving circuit 15 controls potentials of the selection gates SGS and SGD, and controls turning on and turning off the selection transistor SST between the source line SL and the channel body 10, and the selection transistor SDT between the bit line BLn and the channel body 10.

For example, the control circuit 19 controls the word line driving circuit 13 through the row decoder 9, and controls the selection gate line driving circuit 15 and the source line driving circuit 17, thereby writing data to the memory cell array 1, and erasing the data. The control circuit 19 reads the data stored in the memory cell array 1 from the sense amplifier 7 through the column decoder 8.

As shown in FIG. 2B, the memory cell array 1 includes a plurality of memory cell blocks BLK0 to BLK3. Each of the memory cell blocks BLK includes a plurality of memory cell groups GP0 to GP3. Each of the memory cell groups GP includes a plurality of memory strings 50.

Figure 3:
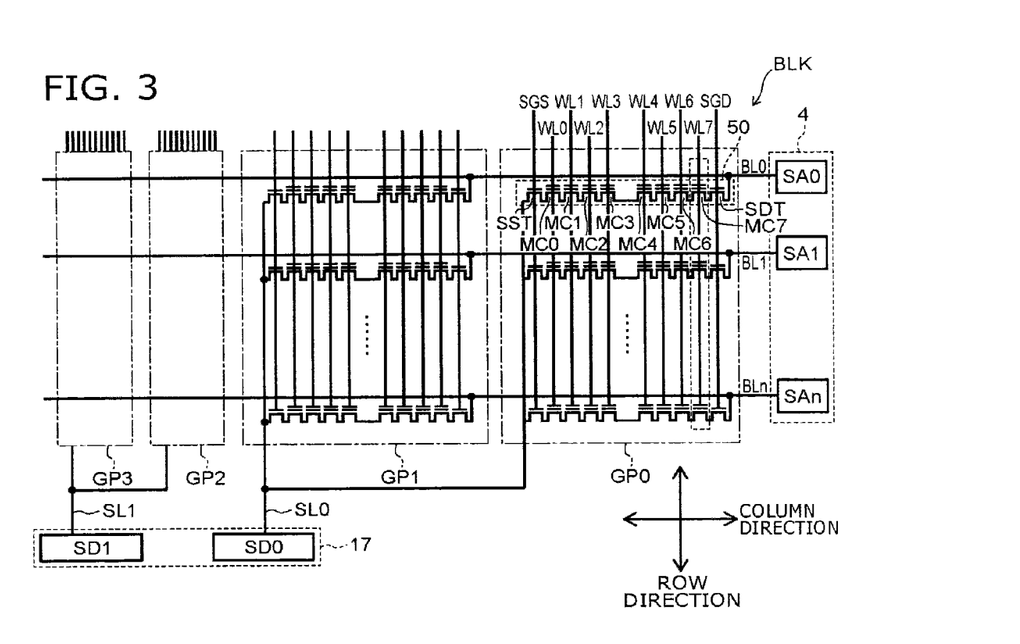
FIG. 3 is an example of a circuit diagram showing the non-volatile memory device according to the first embodiment.

FIG. 3 is an example of a circuit diagram showing the non-volatile memory device 100 according to the first embodiment. FIG. 3 is an equivalent circuit showing one memory cell block BLK.

As shown in FIG. 3, the memory cell block BLK includes the memory cell groups GP0 to GP3. Each memory cell group GP includes, for example, one laminate body. For example, the memory cell group GP0 includes a plurality of memory cells MC0 to MC7 provided in one laminate body.

The one memory string 50 included in the memory cell group GP0 includes, for example, memory cells MC0 to MC7 provided inside the one memory hole 30, and the selection gates SGS and SGD. The memory cells MC0 to MC7 and the selection gates SGS and SGD share the one channel body 10.

The plurality of bit lines BL0 to BLn (n: integer) are respectively and electrically connected to the one channel body 10 provided in each laminate body. Then, the plurality of channel bodies 10 provided in one laminate body share one source line SL.

As shown in FIG. 3, one bit line BL is connected to any of a plurality of sub units SA1 to SAn in the sense amplifier 7. In addition, the memory cell groups GP0 and GP1 share the source line SL0, and the source line SL0 is connected to one sub unit SD0 of the source line driving circuit 17. The memory cell groups GP2 and GP3 share the source line SL1, and the source line SL1 is connected to one sub unit SD1 of the source line driving circuit 17.

For example, the control circuit 19 controls voltages of the selection gates SGS and SGD through the selection gate line driving circuit 15. As a result, any one of the memory cell groups GP0 to GP3 is selected. Specifically, for example, the selection transistors SSTa and SDTa of the memory cell group GP0 are turned on, and the selection transistors SST and SDT of the other memory cell groups GP are turned off.

For example, the control circuit 19 controls the potential of the channel body 10 positioned between each of the bit lines BL0 to BLn and the source line SL0, through the sense amplifier 7 and the source line driving circuit 17. For example, the potential of one of the plurality of channel bodies 10 included in the memory cell group GP0 is selectively controlled.

Furthermore, for example, the control circuit 19 controls a potential difference between each of the plurality of word lines WL0 to WL7 included in the memory cell group GP0, and the channel body 10, through the word line driving circuit 13. As a result, a potential difference which is applied to any one of the plurality of memory cells MC0 to MC7 arranged along the channel body 10 is selectively controlled.

In this manner, the control circuit 19 accesses one of the plurality of memory cells MC included in one memory cell block BLK, and drives the accessed memory cell MC. For example, when a voltage applied to the accessed memory cell MC is higher than that applied to another memory cell, it is possible to write data to the accessed memory cell MC. In addition, a voltage lower than a threshold is applied to the accessed memory cell MC, and a voltage higher than the threshold is applied to another memory cell MC. As a result, it is possible to read the data stored in the accessed memory cell MC.

For example, in the non-volatile memory device 100, the memory cell MCa is arranged in the memory cell block BLK0, and the memory cell MCb is arranged in the memory cell blocks BLK1 to BLK3. As described above, the memory cell MCa includes the memory film 20a, and the memory cell MCb includes the memory film 20b. The outer diameter D1 of the memory film 20a is larger than the outer diameter D2 of the memory film 20b. Thus, the data retention characteristics of the memory cell MCa arranged in the memory cell block BLK0 are better than the data retention characteristics of the memory cells MCb arranged in the memory cell blocks BLK1 to BLK3.

The control circuit 19 drives the memory cells MCa arranged in the memory cell block BLK0 and the memory cells MCb arranged in the memory cell blocks BLK1 to BLK3. Then, for example, the control circuit 19 operates in such a manner that the data which is longer in retention time than the data that is written to the memory cell MCb is written to the memory cell MCa. In other words, the control circuit 19 controls a data address in such a manner that the number of data writings to the memory cells MCb and data erasings in the memory cells MCb is greater than the number of data writings to the memory cells MCa and data erasings in the memory cells MCa.

In the embodiment, for example, a program which executes such an operation in the control circuit 19 is written to the memory cell block BLK0, in an initial state of the non-volatile memory device 100. As a result, it is possible to improve a reliability of the non-volatile memory device 100.

In another embodiment, for example, data which controls the operation of the non-volatile memory device 100, a so-called firmware may be written to the memory cell block BLK0, in an initial state. Then, the firmware may be configured so as to include a program which stops erasing of the data stored in the memory block BLK0 and writing of the data to the memory block BLK0, in the control circuit 19. In other words, the memory cell block BLK0 may be used as a read only memory (ROM). As a result, for example, it is possible to control malfunction at the time of powering on, and to improve the reliability of the non-volatile memory device 100.

For example, in the above-described non-volatile memory device 100, in an initial state before the data writing and data erasing are executed, the memory cell block BLK0 having a large diameter of the memory hole stores the data. The other memory cell blocks do not store the data. That is, in an initial state, the distribution of threshold voltages of the memory cells MCa in the memory cell block BLK0 is different from the distribution of threshold voltages of the memory cells MCa in the other memory cell blocks BLK1 to BLK3.

For example, the number of the memory cells MCa provided in the memory cell block BLK0 is smaller than the number of the memory cells MCb provided in the memory cell blocks BLK1 to BLK3. For example, the size of the memory cell block BLK0 which stores the ROM data is smaller than the sizes of the other memory cell blocks BLK. It is preferable that only the data which requires good data retention characteristics be retained in the memory cell block BLK0. For example, the memory cell block BLK0 has a large memory hole diameter, and thus the bit storage density of the memory cell block BLK0 is low. Thus, in order to suppress reduction of the entire storage capacity, it is preferable that the size of the memory cell block BLK0 be smaller than the sizes of the other memory cell blocks BLK1 to BLK3.

Figure 4:
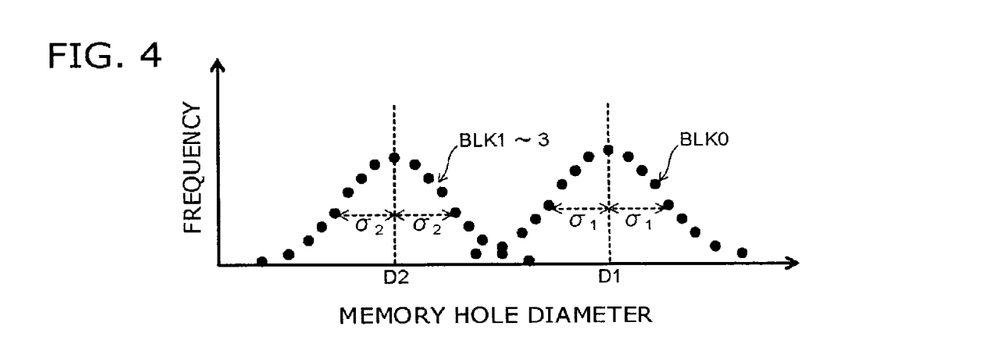
FIG. 4 is a schematic view showing the characteristics of the non-volatile memory device according to the first embodiment.
Figure 5:
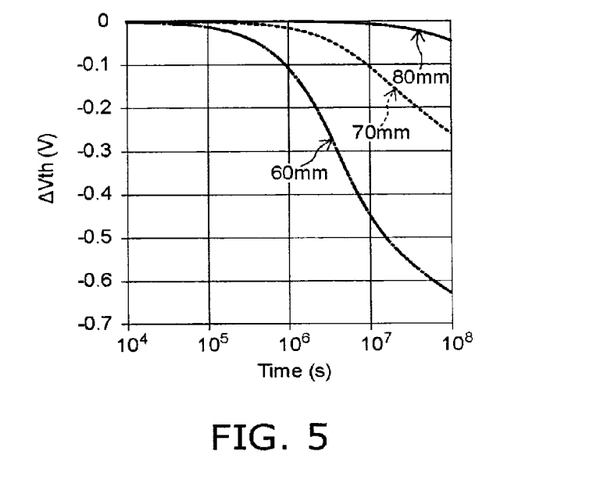
FIG. 5 is a schematic view showing other characteristics of the non-volatile memory device according to the first embodiment.

FIG. 4 and FIG. 5 are schematic views showing the characteristics of the non-volatile memory device 100 according to the first embodiment. FIG. 4 is a schematic view illustrating the distribution of the memory hole diameter in the memory cell blocks BLK0 to BLK3. FIG. 5 is a graph showing a change of the threshold of the memory cell MC with time.

As shown in FIG. 4, the diameters of the plurality of memory holes formed in each of the memory cell blocks BLK have variation. For example, the diameters of the memory holes in each memory cell block BLK have a Gaussian distribution. If a median value (a diameter corresponding to a peak of frequency) of the distribution of the memory hole diameters of the memory cell blocks BLK0 is represented by D1, and a median value (a diameter corresponding to a peak of frequency) of the distribution of the memory hole diameters of the memory cell blocks BLK1 to BLK3 is represented by D2, the formula D1>D2 is satisfied.

For example, if a standard deviation of the diameter distribution of the memory holes in the memory cell blocks BLK1 to BLK3 is represented by σ2, it is preferable that D1>D2±σ2. In addition, if a standard deviation of the diameter distribution of the memory holes in the memory cell block BLK0 is represented by σ1, it is more preferable that D1>D2+σ1+σ2.

In addition, the cross-sectional shape perpendicular to the Z-direction of the memory hole is not limited to a perfect circle, and for example, can be any shape, such as an ellipse, polygons or the like. In such a case, the memory hole diameter $D_H$ can be calculated by using the following formula.

$$D_H = 2 \times (S/\pi)^{1/2} \tag{1}$$

Here, S is an area of the cross-section perpendicular to the Z-direction of the memory hole.

FIG. 5 is a graph showing a result of simulation of a threshold voltage change of the memory cell MC. A horizontal axis represents data retention time, and a vertical axis represents the amount of change ΔVth of the threshold voltage.

The simulation is performed with respect to the memory cells MC provided in each of three memory holes with diameters of 60 nm, 70 nm and 80 nm. The memory film 20 has a structure in which the block insulating film, the electric charge storage layer and the tunnel insulating film are stacked towards a central direction of the memory holes.

The block insulating film includes a silicon nitride film with a thickness of 4 nm in contact with the word line, and a silicon oxide film with a thickness of 7 nm in contact with the silicon nitride film. The electric charge storage layer is formed by a silicon nitride film with a thickness of 5 nm. The tunnel insulating film is formed by a silicon oxide film with a thickness of 5 nm. The electric charge storage layer is in contact with the silicon oxide film in the block insulating film. Furthermore, a depth of the electron trap in the electric charge storage layer is set to 1.5 eV, and when electrons move from the electric charge storage layer to the channel body 10, a barrier height of the tunnel insulating film is set to 3.2 eV.

As shown in FIG. 5, if the memory hole diameter is 70 nm, the threshold voltage of the memory cell MC falls by approximately 0.25 V at a data retention time of $1 \times 10^8$ seconds. If the memory hole diameter is 60 nm, the threshold voltage falls even greater, that is, falls by approximately 0.63 V at the data retention time of $1 \times 10^8$ seconds. In contrast to this, if the memory hole diameter is 80 nm, an amount by which the threshold voltage falls is suppressed to approximately 0.05 V at the data retention time of $1 \times 10^8$ seconds.

FIG. 5 shows a remarkable improvement of the data retention characteristics according to expansion of the memory hole diameter. For example, the variation of the threshold voltage of the memory cell MCa is smaller than the variation of the threshold voltage of the memory cell MCb. Thus, it is possible to have a greater number of multiple value levels of the memory cell MCa than the number of multiple value levels of the memory cell MCb. Then, if the rate of increase of storage bit density due to the introduction of multiple value levels is greater than the rate of decrease of the storage bit density due to enlargement of the memory hole diameter, it is also possible to increase the storage capacity of the non-volatile memory device 100.

Figure 6:
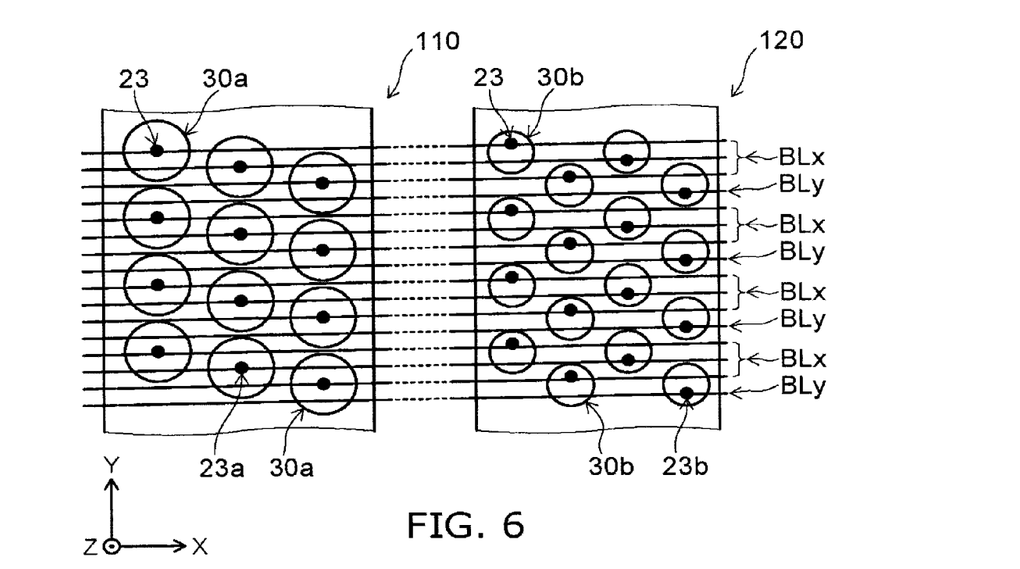
FIG. 6 is an example of a schematic planar view showing a structure of the memory cell array according to the first embodiment.

FIG. 6 is an example of a schematic planar view showing a structure of the memory cell array 1 according to the first embodiment. FIG. 6 shows a relationship between the memory holes 30a and 30b, and the plurality of bit lines BL which are arranged in the laminate bodies 110 and 120.

As shown in FIG. 6, for example, the plurality of bit lines BL extend in the X-direction, and are provided so as to be mounted over the laminate bodies 110 and 120. For example, each bit line BL is electrically connected to the channel body 10 provided inside any of the memory holes through the contact plug 23. For example, each bit line BL is electrically connected to the channel body 10a provided inside any one of the plurality of memory holes 30a arranged in the laminate body 110. In addition, each bit line BL is electrically connected to the channel body 10b provided inside any one of the plurality of memory holes 30b arranged in the laminate body 120.

According to the embodiment, the diameter of the memory hole 30a is larger than the diameter of the memory hole 30b. For example, if the sizes of the laminate bodies 110 and 120 are the same, the number of memory holes 30a provided in the laminate body 110 is smaller than the number of memory holes 30b provided in the laminate body 120.

The non-volatile memory device 100 includes the plurality of bit lines BL which are electrically connected to at least one of the channel body 10a and the channel body 10b. As illustrated in FIG. 6, the plurality of bit lines BL include a first bit line BLx and a second bit line BLy. The first bit line BLx is electrically connected to both the channel body 10a and the channel body 10b. The second bit line BLy is not electrically connected to the channel body 10a, and is electrically connected to the channel body 10b.

In another embodiment, for example, a width of the laminate body 110 widens in the X-direction, therefore the number of the memory holes 30a may be the same as the number of the memory holes 30b. In such a case, it is possible to configure in such a manner that the plurality of bit lines BL include only the first bit lines BLx which are electrically connected to both the channel body 10a provided in any one of the memory holes 30a and the channel body 10b provided in any one of the memory holes 30b.

Figure 7A:
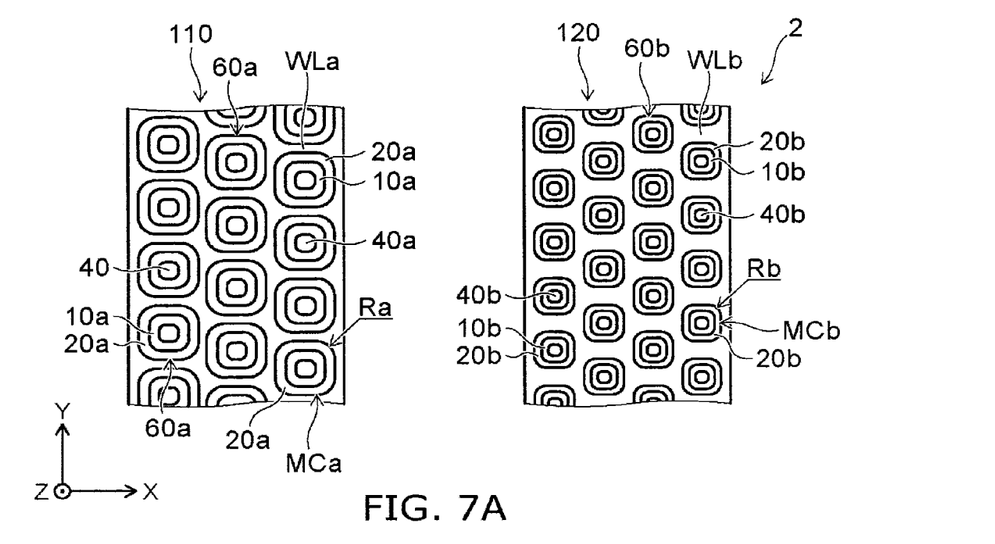
Figure 7B:
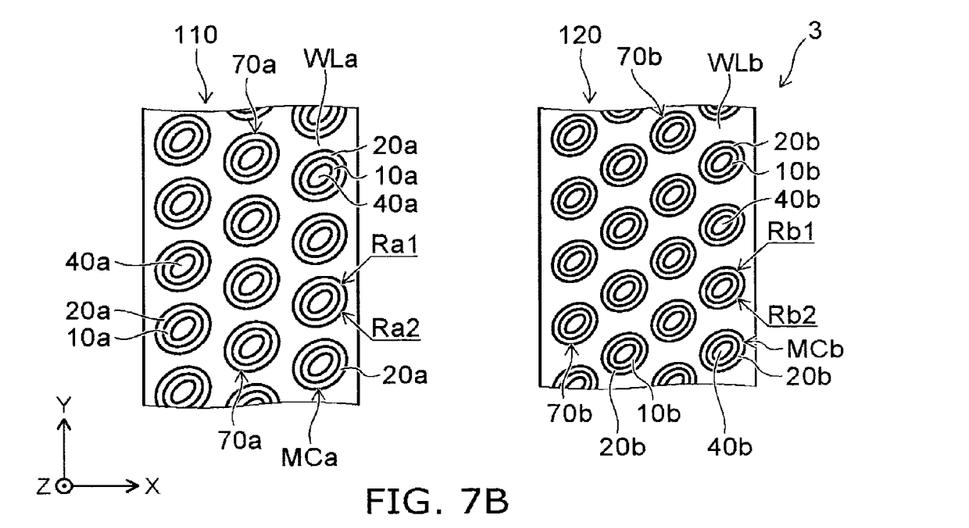

FIGS. 7A and 7B are examples of schematic planar views showing the memory cell arrays 2 and 3 according to variations of the first embodiment. FIG. 7A and FIG. 7B respectively show the shapes of the cross-section perpendicular to the Z-direction of the memory holes 60a, 60b, 70a and 70b. In addition, the word lines WLa and WLb which are illustrated in FIGS. 7A and 7B are positioned at the same laminate level among a plurality of word lines WL.

In the example shown in FIG. 7A, memory holes 60a are provided in the laminate body 110, and memory holes 60b are provided in the laminate body 120. Each cross-section of the memory holes 60a and 60b has a rectangular shape, and four corners thereof are rounded. A radius of curvature of the four corners of the memory hole 60a is, for example, Ra. A radius of curvature of the four corners of the memory hole 60b is, for example, Rb.

The channel body 10a, the memory film 20a, and a core 40a are provided inside the memory hole 60a. The channel body 10b, the memory film 20b, and a core 40b are provided inside the memory hole 60b. The memory film 20a has a curved surface in which a radius of curvature of an outer perimeter is Ra. The memory film 20b has a curved surface in which a radius of curvature of an outer perimeter is Rb.

The radius of curvature Ra is larger than the radius of curvature Rb. Thus, a minimum voltage required for writing data to the memory cell MCa including the memory film 20a is greater than a minimum voltage required for writing data to the memory cell MCb including the memory film 20b (the same is also true for data erasing). In addition, for the same reason as this (the concentration of electric field towards the tunnel insulating film can be relieved because the radius of curvature is large), the memory cell MCa is better in data retention characteristics than the memory cell MCb.

In the example shown in FIG. 7B, memory holes 70a are provided in the laminate body 110, and memory holes 70b are provided in the laminate body 120. Each of cross-sections of the memory holes 70a and 70b have an elliptical shape, and have radiuses of curvature different from each other in two axial directions of the ellipse.

For example, a cross-section perpendicular to the Z-direction of the memory hole 70a has radiuses of curvature Ra1 and Ra2. The radius of curvature Ra1 is smaller than the radius of curvature Ra2. For example, a cross-section perpendicular to the Z-direction of the memory hole 70b has radiuses of curvature Rb1 and Rb2. The radius of curvature Rb1 is smaller than the radius of curvature Rb2.

The channel body 10a, the memory film 20a, and the core 40a are provided inside the memory hole 70a. The channel body 10b, the memory film 20b, and the core 40b are provided inside the memory hole 70b. Radiuses of curvature of the perimeter of the memory film 20a are Ra1 and Ra2. Radiuses of curvature of the perimeter of the memory film 20b are Rb1 and Rb2.

In the memory cell MCa including the memory film 20a, a minimum voltage for writing (or erasing) the data is determined by the radius of curvature Ra1 which is the smaller one of the two radiuses of curvature Ra1 and Ra2. In the memory cell MCb including the memory film 20b, a minimum voltage for writing (or erasing) the data is determined by the radius of curvature Rb1 which is the smaller one of the two radiuses of curvature Rb1 and Rb2. Then, the radius of curvature Ra1 is larger than the radius of curvature Rb1. Thus, the minimum voltage required for writing the data to the memory cell MCa is greater than the minimum voltage required for writing the data to the memory cell MCb. In addition, for the same reason as this (the concentration of electric field towards the tunnel insulating film can be relieved because the radius of curvature is large), the memory cell MCa including the memory film 20a is better in data retention characteristics than the memory cell MCb including the memory film 20b.

The embodiment is not limited to the examples shown in FIGS. 7A and 7B. For example, a cross-sectional shape perpendicular to the Z-direction of the memory hole may be an arbitrary shape with an arbitrary number of radiuses of curvature. Then, the minimum value of the radiuses of curvature of the cross-section perpendicular to the Z-direction of the memory film 20a provided between any one of the plurality of word lines WLa and the channel body 10a is greater than the minimum value of the radiuses of curvature of the cross-section perpendicular to the Z-direction of the memory film 20b.

Figure 8:
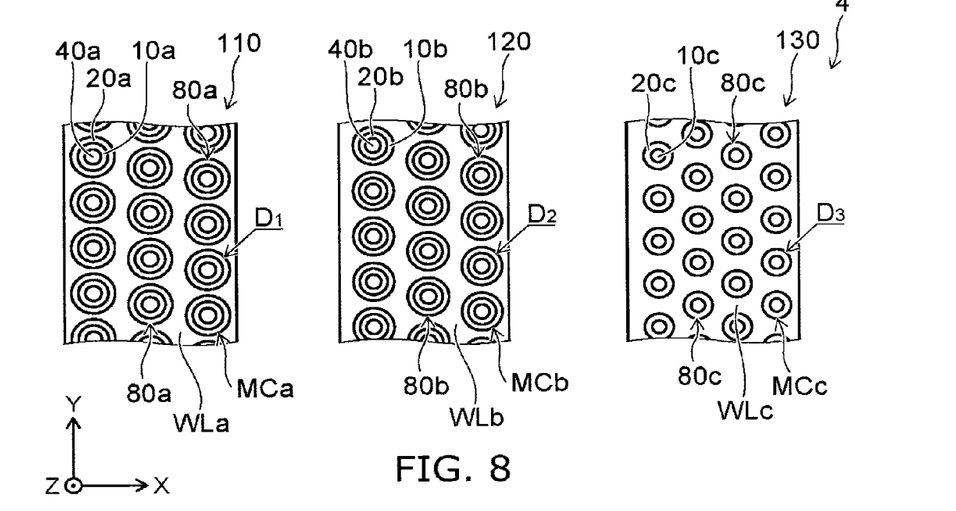

FIG. 8 is an example of a schematic planar view showing another memory cell array 4 according to the variation of the first embodiment. FIG. 8 shows a cross-sectional shape perpendicular to the Z-direction of memory holes 80a, 80b and 80c. In addition, the word lines WLa, WLb and WLc are positioned at the same laminate level among the plurality of word lines WL.

In the example shown in FIG. 8, the memory hole 80a is provided in the laminate body 110, the memory hole 80b is provided in the laminate body 120, and the memory hole 80c is provided in a laminate body 130. The cross-sections of the memory holes 80a, 80b and 80c have diameters D1, D2 and D3, respectively. Then, D1 is larger than D2, and D2 is larger than D3.

The channel body 10a, the memory film 20a, and the core 40a are provided inside the memory hole 80a. The channel body 10b, the memory film 20b, and the core 40b are provided inside the memory hole 80b. The channel body 10c and the memory film 20c are provided inside the memory hole 80c. The outer diameter of the memory film 20a is D1, the outer diameter of the memory film 20b is D2, and an outer diameter of the memory film 20c is D3. For example, D1 is set to be 120 nm, D2 is set to be 100 nm, and D3 is set to be 80 nm.

TABLE 1

| | Memory cell block | | |
|---|---|---|---|
| | BLK0 | BLK1 | BLK2, 3 |
| Outer diameter of memory film | large | ← | small |
| Data retention characteristics | good | ← | poor |
| Repeated operation endurance | low | → | high |
| Multiple value levels | — | high | low |

For example, the laminate body 110 is provided in the memory cell block BLK0. In addition, the laminate body 120 is provided in the memory cell block BLK1. The laminate body 130 is provided in the memory cell blocks BLK2 and BLK3. Table 1 illustrates the characteristics of memory cells arranged in each memory cell block.

The outer diameter of the memory film 20 in the memory cell MCa of the memory cell block BLK0 is the largest one, and the outer diameters of the memory films 20 in memory cells MCc of the memory cell blocks BLK2 and BLK3 are the smallest ones. In contrast to this, the data retention characteristics of the memory cell block BLK0 is the best one, and the data retention characteristics of the memory cell blocks BLK2 and BLK3 are the poorest ones. The data retention characteristics of the memory cell block BLK1 have an intermediate level between the data retention characteristics of the memory cell block BLK0 and the memory cell blocks BLK2 and BLK3.

For example, if the thicknesses in the direction perpendicular to the Z-direction of the memory films 20a to 20c are the same as each other, a large voltage (that is, high energy) is required for writing (or erasing) data to the memory cell block BLK0 including the memory film 20a with a large outer diameter. Due to this, in the repeated operations of writing and erasing, the tunnel insulating film is degraded by the carriers (electrons and positive holes) with high energy. In addition, since the electric field of the block insulating film is strong at the time of writing and erasing in the memory cell MCa with a large outer diameter of the memory film 20, a proportion of the carriers (electrons and positive holes) passing through the electric charge storage layer without being trapped is higher than that in the memory cell MCc with a small outer diameter of the memory film 20. Due to this, in the memory cell MCa, an amount of electric charges passing through during the repeated operations of writing and erasing increases, and a rate of degrading of the memory film increases. Because of the above-described two reasons, the memory cell MCa with a large outer diameter of the memory film 20 has a low endurance with respect to repeated writing and erasing. That is, the memory cell block BLK0 has good data retention characteristics in a fresh state, and has poor data retention characteristics after repeated operations of writing and erasing. Thus, for example, it is preferable that the memory cell block BLK0 be used as a ROM (Read Only Memory) that stores the data which is not rewritten and erased.

Meanwhile, the memory cell blocks BLK2 and BLK3 have poor data retention characteristics in a fresh state, and have good data retention characteristics after repeated operations of writing and erasing. Thus, it is preferable that the memory cell blocks BLK2 and BLK3 be used as memory areas in which the data is frequently written and erased. It is preferable that the memory cell block BLK1 with intermediate data retention characteristics be used as memory areas in which the number of writing and erasing operations is small. In addition, the data retention characteristics in the fresh state of the memory cell block BLK1 are better than the data retention characteristics of the memory cell blocks BLK2 and BLK3. Due to this, if it is assumed that the number of writing and erasing operation is small, the memory cell MCb arranged in the memory cell block BLK1 can have better multiple value levels than the memory cell MCc arranged in the memory cell blocks BLK2 and BLK3. For example, the memory cell MCb may be configured by a three-bit cell and the memory cell MCc may be configured by a two-bit cell.

As described above, for example, the non-volatile memory device 100 can include three or more types of memory cell blocks having memory hole diameters different from each other. Then, the data is stored by selecting the memory cell block which is appropriate for the number of required rewriting and for data retention time, and thereby it is possible to improve the reliability of the non-volatile memory device 100.

Second Embodiment

Figure 9:
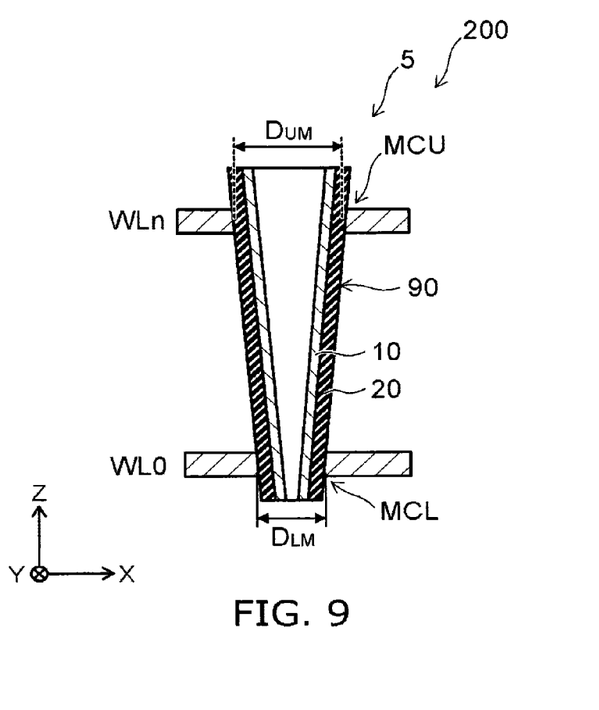
FIG. 9 is an example of a schematic view showing a non-volatile memory device according to a second embodiment.

FIG. 9 is an example of a schematic cross-sectional view showing a memory cell array 5 of a non-volatile memory device 200 according to a second embodiment. FIG. 9 shows a cross-section in parallel with an X-Z plane of a memory hole 90.

As shown in FIG. 9, the memory hole 90 is provided in a tapered shape, a diameter of which becomes smaller downwardly from the top (−Z-direction). The memory hole 90 passes through word lines WL0 to WLn. A memory film 20, a channel body 10, and a core 40 are sequentially formed in an inside wall of the memory hole 90. The memory film 20 is positioned between each of the word lines WL0 to WLn and the channel body 10. In addition, for the sake of simplicity, word lines WL1 to WLn−1 are not shown in FIG. 9.

For example, an outer diameter of the memory film 20 positioned between the word line WLn which is a top layer of the word lines WL0 to WLn, and the channel body 10, is DUM. An outer diameter of the memory film 20 positioned between the word line WL0 which is a bottom layer of the word lines WL0 to WLn, and the channel body 10, is DLM. Then, the DUM is larger than the DLM. In addition, the DUM is larger than an outer diameter of the memory film 20 positioned between each of the plurality of word lines WL1 to WLn−1 which are not shown, and the channel body 10.

For example, a first memory cell (hereinafter, memory cell MCU) is formed between the word line WLn and the channel body 10. A second memory cell (hereinafter, memory cell MCL) is formed between each of the word lines WL0 to WLn−1 and the channel body 10. That is, the outer diameter of the memory film 20 included in the memory cell MCU is larger than the outer diameter of the memory film 20 included in the memory cell MCL. Thus, the memory cell MCU has better data retention characteristics than those of the memory cell MCL.

For example, the non-volatile memory device 200 includes a peripheral circuit shown in FIG. 2A. Then, the control circuit 19 illustrated in FIG. 2A writes the data having a longer retention time than that of the data which is written to the memory cell MCL, to the memory cell MCU. In other words, the control circuit 19 controls addresses of the data in such a manner that the number of writings and erasings of the data of the memory cell MCL is greater than the number of writings and erasings of the data of the memory cell MCU.

As shown in FIG. 9, if the memory hole 90 has a tapered shape, the memory film 20 positioned between the word line WL of an upper layer and the channel body 10 has a larger outer diameter than that of the memory film 20 positioned between the word line WL of a lower layer and the channel body 10. Thus, the memory cell MC of the upper layer has better data retention characteristics than the memory cell MC of the lower layer. Therefore, the control circuit 19 may control the address in such a manner that the data having a longer retention time than that of the data which is written to the memory cell MC of the lower layer is written to the memory cell of the upper layer.

For example, the data with a long retention time may be written to the memory cell MC formed between each of the three word lines WLn-2 to WLn of the upper layer and the channel body 10, and the data with a short retention time may be written to the memory cell MC formed between the word line WL of the layer lower than those and the channel body 10.

The cross-sectional shape in parallel with the X-Z plane of the memory hole is not limited to a tapered shape. That is, the control circuit 19 may control in such a manner that the data with a long retention time is written to the memory cell MCa including the memory film 20 having the largest outer diameter of the plurality of memory cells MC arranged in the Z-direction of one memory hole, and the data with a short retention time is written to the other memory cells MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
   a plurality of first electrodes stacked in a first direction;
   at least one first semiconductor layer extending in the first direction through the first electrodes;
   a first memory film provided between each of the first electrodes and the first semiconductor layer;
   a plurality of second electrodes stacked in the first direction and provided together with the first electrodes in a second direction orthogonal to the first direction;
   at least one second semiconductor layer extending in the first direction through the second electrodes; and
   a second memory film provided between each of the second electrodes and the second semiconductor layer,
   an outer diameter of the first memory film provided between one of the first electrodes and the first semiconductor layer being larger than an outer diameter of the second memory film provided between one of the second electrodes positioned in the same laminate level as the one of the first electrodes and the second semiconductor layer.

2. The device according to claim 1, further comprising:
   a circuit configured to drive a first memory cell including the first memory film and a second memory cell including the second memory film, the circuit writing data to the first memory cell with a longer retention time than data being written to the second memory cell.

3. The device according to claim 1, further comprising:
a circuit configured to drive a first memory cell including the first memory film and a second memory cell including the second memory film,
the circuit controlling an address of data so that a number of writings and erasings with respect to the second memory cell is greater than a number of writings and erasings with respect to the first memory cell.

4. The device according to claim 1, further comprising:
a first memory cell block provided with a plurality of first memory cells including the first memory film;
a second memory cell block provided with a plurality of second memory cells including the second memory film; and
a circuit configured to drive the first memory cells and the second memory cells,
the circuit controlling an address of data so that a number of writings and erasings with respect to the second memory cells being greater than a number of writings and erasings with respect to the first memory cells.

5. The device according to claim 4,
wherein the circuit uses the first memory cells block as a ROM.

6. The device according to claim 1,
wherein the first memory film has same film structure as structure of the second memory film.

7. The device according to claim 1, further comprising:
a plurality of first memory cells including the first memory film; and
a plurality of second memory cells including the second memory film,
a number of the first memory cells being smaller than a number of the second memory cells.

8. The device according to claim 2,
wherein a number of multiple value levels of the first memory cell is greater than a number of multiple value levels of the second memory cell.

9. The device according to claim 1, further comprising:
a plurality of bit lines electrically connected to at least one of the first semiconductor layer and the second semiconductor layer,
the bit lines including,
a first bit line electrically connected to both the first semiconductor layer and the second semiconductor layer, and
a second bit line not electrically connected to the first semiconductor layer but electrically connected to the second semiconductor layer.

10. The device according to claim 1, further comprising:
a plurality of third electrodes stacked in the first direction and provided together with the first electrodes and the second electrodes in the second direction;
at least one third semiconductor layer extending in the first direction through the third electrodes; and
a third memory film provided between each of the third electrodes and the third semiconductor layer,
an outer diameter of the third memory film provided between one of the third electrodes and the third semiconductor layer being smaller than an outer diameter of the second memory film provided between one of the second electrodes positioned in same laminate level as the one of the third electrodes and the second semiconductor layer.

11. The device according to claim 10, further comprising:
a circuit configured to drive a first memory cell including the first memory film, a second memory cell including the second memory film, and a third memory cell including the third memory film,
the circuit writing data to the second memory cell with a longer retention time than data being written to the third memory cell, and writing data to the first memory cell with a longer retention time than data being written to the second memory cell.

12. The device according to claim 10, further comprising:
a circuit configured to drive a first memory cell including the first memory film, a second memory cell including the second memory film, and a third memory cell including the third memory film,
the circuit controlling an address of data so that a number of writings and erasings with respect to the third memory cell is greater than a number of writings and erasings with respect to the second memory cell, and so that a number of writings and erasings with respect to the second memory cell is greater than a number of writings and erasings with respect to the first memory cell.

13. The device according to claim 12, further comprising:
a first memory cell block provided with the first memory cell;
a second memory cell block provided with the second memory cell; and
a third memory cell block provided with the third memory cell.

14. The device according to claim 13,
wherein the circuit uses the first memory cell block as a ROM.

15. The device according to claim 3,
wherein a number of multiple value levels of the first memory cell is greater than a number of multiple value levels of the second memory cell.

* * * * *